US006869874B2

(12) United States Patent
Kim et al.

(10) Patent No.: US 6,869,874 B2
(45) Date of Patent: Mar. 22, 2005

(54) METHOD FOR FABRICATING CONTACT PLUG WITH LOW CONTACT RESISTANCE

(75) Inventors: Hai-Won Kim, Ichon-shi (KR); Su-Jin Chae, Ichon-shi (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/330,303

(22) Filed: Dec. 30, 2002

(65) Prior Publication Data

US 2003/0216030 A1 Nov. 20, 2003

(30) Foreign Application Priority Data

May 18, 2002 (KR) ........................................ 2002-27591

(51) Int. Cl.⁷ .............................................. H01L 21/44
(52) U.S. Cl. ...................... 438/652; 438/657; 438/672; 438/674; 438/675
(58) Field of Search ................................ 438/652, 657, 438/659, 672, 674–675

(56) References Cited

U.S. PATENT DOCUMENTS

| 5,122,476 | A |   | 6/1992  | Fazan et al. |         |
|-----------|---|---|---------|--------------|---------|
| 5,296,388 | A |   | 3/1994  | Kameyama et al. |      |
| 5,324,684 | A | * | 6/1994  | Kermani et al. | 438/566 |
| 5,340,753 | A |   | 8/1994  | Bassous et al. |        |
| 5,475,257 | A |   | 12/1995 | Hashimoto et al. |     |
| 5,506,431 | A |   | 4/1996  | Thomas |              |
| 5,747,856 | A |   | 5/1998  | Chen et al. |         |
| 5,821,149 | A |   | 10/1998 | Schuppen et al. |       |
| 5,841,197 | A |   | 11/1998 | Adamic, Jr. |         |
| 5,882,165 | A | * | 3/1999  | Maydan et al. | 414/217 |
| 6,015,990 | A |   | 1/2000  | Hieda et al. |         |
| 6,030,894 | A | * | 2/2000  | Hada et al. | 438/675 |
| 6,245,604 | B1 |  | 6/2001  | Violette et al. |      |
| 6,368,405 | B1 | * | 4/2002  | Shin | 117/93 |
| 2003/0005881 | A1 | * | 1/2003 | Shin | 117/97 |
| 2003/0087512 | A1 | * | 5/2003 | Cheong | 438/595 |

FOREIGN PATENT DOCUMENTS

| JP | 2-91976 A    | 3/1990  |
| JP | 2-138734 A   | 5/1990  |
| JP | 2-248078 A   | 10/1990 |
| JP | 6-45344 A    | 2/1994  |
| JP | 7-321290 A   | 12/1995 |
| JP | 8-78785 A    | 3/1996  |
| KR | 2001-4983    | 1/2001  |
| KR | 2002-0083700 A | 11/2002 |

* cited by examiner

Primary Examiner—Hsien-Ming Lee
(74) Attorney, Agent, or Firm—Birch, Stewart, Kolasch & Birch, LLP

(57) ABSTRACT

The present invention provides a method for forming a contact plug of a semiconductor device with a low contact resistance. The inventive method includes the steps of: forming a contact hole in an inter-layer insulating layer formed on a silicon substrate; removing a native oxide layer formed in the contact hole; forming a single crystal silicon layer on a surface of the silicon substrate in the contact hole, wherein the single crystal silicon layer is formed by an epitaxial growth performed at a first reaction chamber of which pressure is maintained less than approximately $10^{-6}$ Torr; and filling the contact hole with polysilicon, wherein the polysilicon layer is formed at a second reaction chamber.

13 Claims, 4 Drawing Sheets

METHOD FOR FABRICATING CONTACT PLUG WITH LOW CONTACT RESISTANCE

This nonprovisional application claims priority under 35 U.S.C. § 119(a) on Patent Application No. 2002-0027591 filed in KOREA on May 18, 2002, which is herein incorporated by reference.

FIELD OF THE INVENTION

The present invention relates to a method for forming a contact plug in a semiconductor device; and, more particularly, to a method for forming a contact plug with low contact resistance in a semiconductor device.

DESCRIPTION OF RELATED ARTS

Generally, as a semiconductor device has been developed to be highly integrated, downsized and speeded, attaining of a contact process margin becomes a current focus on a development of the semiconductor device. Also, it is required to develop a semiconductor device having a faster signal transmission speed for processing information rapidly. In a semiconductor device, a contact hole is formed to electrically connect a lower conductive layer and an upper conductive layer. Since the size of a highly integrated semiconductor device becomes progressively decreased, a method for forming a landing plug contact is adapted to bury the contact hole moderately. The landing plug means that a formation of a polysilicon plug on a very near vicinity of a bit line contact and a charge storage electrode contact is followed by a formation of a word line, and then, a bit line is formed, relaying a subsequent formation of a charge storage electrode. Therefore, the landing plug is a kind of a self-align contact (hereinafter referred as to SAC) process.

Also, it is a trend in today to form a conductive layer applied to a word line, a bit line, a capacitor, a metal wiring and so forth by using a metal having an excellent conductivity in order to construct a semiconductor device with a high speed. As mentioned, a semiconductor device in today has been extensively downsized and micronized. For instance, in case of a memory device such as a dynamic random access memory (DRAM) including one transistor and one capacitor, it is almost enabled to manufacture a DRAM with 256 mega or 1 giga bites of capacitance.

In the course of a current trend in increasing a level of integration of a memory device or a general logic device, as a cell size becomes decreased in a highly integrated device wherein a circuit line-width is less than 0.13 µm, a contact size and a junction depth also become decreased. Therefore, it is difficult to obtain contact resistance for attaining an electric characteristic of the device.

FIGS. 1A to 1D are cross-sectional views illustrating a method for forming a typical contact plug. With reference to FIG. 1A, a transistor including a gate insulating layer 11, a gate electrode 12 and a source/drain junction 15 is formed on a substrate and an inter-layer insulating layer 16 is deposited thereon. Obviously, in accordance with a typical procedure for forming a contact hole, on top of the gate electrode 12, a capping insulating layer 13 is formed, and a spacer insulating layer 14 is formed on lateral sides of the gate electrode.

The gate electrode 12 has also a typical structure constituted with a conductive body made with a polysilicon layer or stacked polysilicon layers, a diffusion barrier and so forth. Various types of an oxide layer can be used for an inter-layer insulating layer 16, e.g., boro phospho silicate glass (BPSG), spin on glass (SOG), undoped silicate glass (USG), phospho silicate glass (PSG) and so on.

After forming the inter-layer insulating layer 16 as the above, a chemical mechanical polishing (hereinafter referred as to CMP) process or a flow process to the inter-layer insulating layer 16 is performed to planarize a surface of the inter-layer insulating layer 16. Then, as shown in FIG. 1B, a landing plug contact hole 17 (hereinafter referred as to contact hole) is formed by applying an etching process through the use of a contact mask (not shown). For the etching process for forming the contact hole 17, the etching is overly carried out exceeding in approximately 30% more than a regular etching to form firmly the contact hole 17 so as to expose the substrate 10.

After forming the contact hole 17, a washing process is proceeded to remove a native oxide layer existing within the contact hole 17. Herein, the native oxide is removed with wet process using a buffer oxide etchant (hereinafter referred as to BOE) or HF solution. Also, the native oxide can be removed with HF vapor.

Referring to FIG. 1C, polysilicon is buried inside of the contact hole 17 including an upper part of the inter-layer insulating layer 16.

Presently, a process for forming a polysilicon contact plug 18 is mostly carried out in a batch type equipment or a single chamber type equipment. In case of forming the polysilicon contact plug 18 by using the batch type equipment, it is possible to obtain an excellent step coverage but impossible to perform an in-situ washing due to an equipment structure.

Accordingly, if the process for forming the polysilicon contact plug 18 is carried out in the batch type equipment, polysilicon is deposited all at once to several hundreds of wafers when all of them are loaded to the batch type equipment. At this time, there is a problem in that the native oxide layer is re-grown because the inner the contact hole 17 is exposed in air during a period for loading the wafers to the batch type equipment.

In other words, even if the washing process for removing the native oxide layer is performed with use of BOE, HF solution or HF vapor after forming the contact hole 17 as described above, the re-growth of the native oxide layer at the inner contact hole 17 during a period for loading the wafers to the batch type equipment becomes a factor for increasing contact resistance.

To solve the above problem, there suggested a method for using a single chamber type equipment having an in-situ washing function together with the batch type equipment, and this method is especially applied to the process for forming the polysilicon contact plug 18.

In the above suggested method, the process for forming the polysilicon contact plug 18 is proceeded as the following: after the washing process for removing the native oxide layer with use of the BOE, HF solution or HF vapor, the in-situ washing is carried out in the single chamber type equipment so that a first polysilicon thin film is deposited inside of the contact hole 17; thereafter, a second polysilicon thin film is deposited through the use of the batch type equipment so as to fill the contact hole 17.

The in-situ washing carried out in the singe chamber type equipment uses a hydrogen bake process or a rapid thermal process, and particularly, the in-situ washing process is applied to the formation of the polysilicon contact plug 18 in order to suppress the re-growth of the native oxide layer.

However, in case of adapting the in-situ washing process, e.g., the hydrogen bake process or the rapid thermal process, it has an effect of suppressing the re-growth of the native oxide layer; however, the polysilicon should be deposited by using sequentially both of the single chamber type equipment and the batch type equipment. Also, there is another problem in that the polysilicon contact plug formation process becomes more complex, e.g., the in-situ washing process is proceeded merely in the single chamber type equipment. Moreover, the hydrogen bake process and the rapid thermal process adapted to the in-situ washing process are the processes performed at a very high temperature. This fact of high temperature condition causes a transistor to be vulnerable in more extents to degradation of its characteristics.

SUMMARY OF THE INVENTION

It is, therefore, an object of the present invention to provide a method for forming a contact plug capable of decreasing contact resistance by controlling a formation of a native oxide layer as simultaneously as achieving a simplified process.

In accordance with an aspect of the present invention, there is provided a method for forming a semiconductor device, comprising the steps of: forming a contact hole in an interlayer insulating layer formed on a silicon substrate; removing a native oxide layer formed in the contact hole; forming a single crystal silicon layer on a surface of the silicon substrate in the contact hole, wherein the single crystal silicon layer is formed by an epitaxial growth performed at a first reaction chamber of which pressure is maintained less than approximately $10^{-6}$ Torr; and filling the contact hole with polysilicon, wherein the polysilicon layer is formed at a second reaction chamber.

In summary, the present invention relates to a method for forming a contact plug capable of reducing contact resistance resulted from micronization of a contact plug size as a semiconductor device has been highly densified. In particular, the present invention adapts a high vacuum system that puts a single crystal silicon firstly through an epitaxial growth at an inner contact hole without performing an in-situ washing process. After the epitaxial growth, a polysilicon contact plug is formed by using a typical batch type equipment. Then, performing a chemical mechanical polishing process or an etchback process completes a contact plug formation.

BRIEF DESCRIPTION OF THE DRAWING(s)

The above and other objects and features of the present invention will become apparent from the following description of the preferred embodiments given in conjunction with the accompanying drawings, in which.

DETAILED DESCRIPTION OF THE INVENTION

Other objects and aspects of the invention will become apparent from the following description of the embodiments with reference to the accompanying drawings, which is set forth hereinafter.

FIGS. 2A to 2D are cross-sectional views depicting a method for forming a contact plug in accordance with the present invention. Referring to FIGS. 2A to 2D, the processes until forming a contact hole are identical to those adapted in the prior art.

Figure 1A:
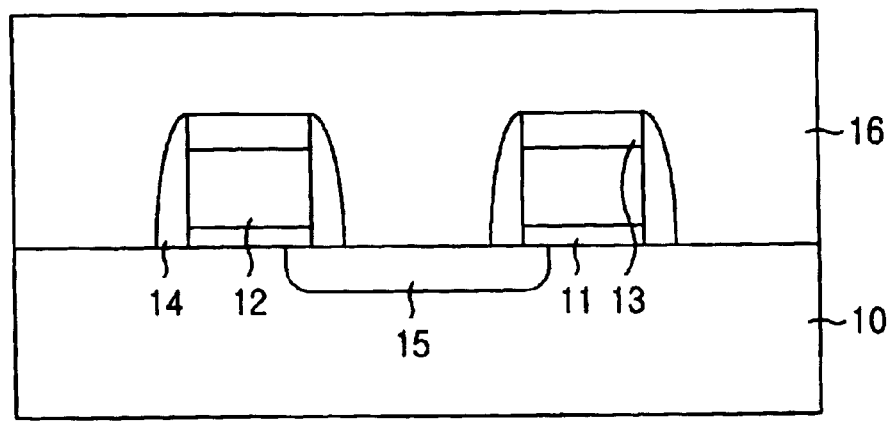
FIG. 1A is a cross-sectional view showing a prior art method for preparing a semi-finished semiconductor substrate.
Figure 1B:
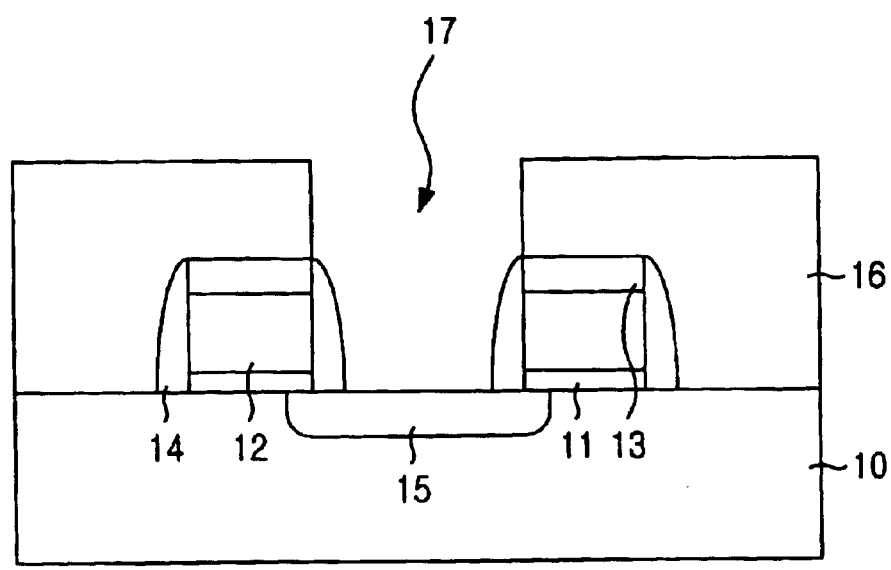
FIG. 1B is a cross-sectional view showing a prior art method for forming a contact hole on the semi-finished semiconductor substrate.
Figure 1C:
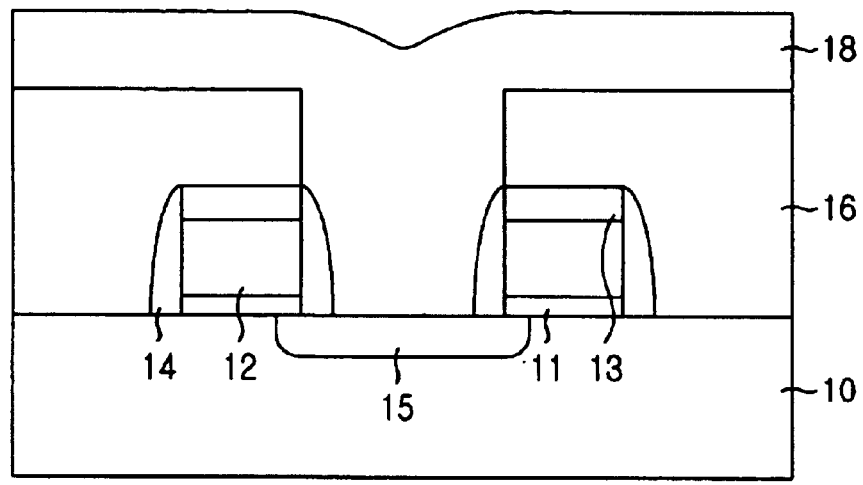
FIG. 1C is a cross-sectional view showing a prior art method for filling into a polysilicon into the contact hole.
Figure 1D:
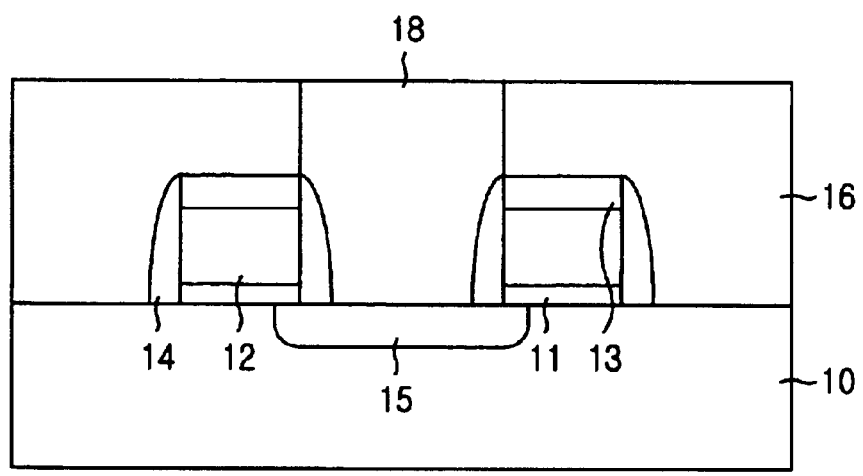
FIG. 1D is a cross-sectional view showing a prior art method for forming a polysilicon contact plug by planarizing the polysilicon.

That is, as shown in FIG. 1A, a transistor including a gate insulating layer 21, a gate electrode 22 and a source/drain junction 25 is formed on a substrate 20. Then, an inter-layer insulating layer 26 is deposited thereon. Obviously, in accordance with the typical process for forming the transistor, a capping insulating layer 23 is formed on top of the gate electrode 22, and a spacer insulating layer 24 (hereinafter referred as to spacer) is formed on lateral sides of the gate electrode 22.

The spacer 24, as described the above, is formed on the lateral sides of the gate electrode 22 by depositing a nitride layer on the substrate 20 including the gate electrode 22, and then, an etchback process is performed thereto. At this time, when applying the etchback process for forming the spacer, it is preferable to proceed an over-etching exceeding in approximately 30% greater than a regular etching so that a surface of the substrate 20 is definitely exposed.

The gate electrode 22 has a typical structure constructed with a metal, polysilicon or a conductive body stacked with the metal and the polysilicon and a diffusion barrier. The inter-layer insulating layer 26 can use various types of an oxide layer such as boro phospho silicate glass (BPSG), spin on glass (SOG), undoped silicate glass (USG), phospho silicate glass (PSG) and so on.

After forming the inter-layer insulating layer 26, a chemical mechanical polishing (hereinafter referred as to CMP) process or a flow process to the inter-layer insulating layer 26 is performed so as to planarize a surface of the interlayer insulating layer 26.

Next, an etching process is proceeded with use of a contact mask (not shown) as to form a landing plug contact hole 27 (hereinafter referred as to contact hole). A native oxide layer formed inside of the contact hole 27 is then removed through a washing process. In the etching process for forming the contact hole 27, an over-etching process preferably exceeding in approximately 30% greater than a regular etching process is adapted to expose completely a surface of the substrate 20.

After the etching process for forming the contact hole 27, a solely typical washing process is carried out in the present invention instead of performing an in-situ washing process, e.g., a hydrogen bake process or a rapid thermal process. That is, a buffer oxide etchant (BOE), HF solution or HF vapor is employed for the typical washing process to remove the native oxide layer formed inside of the contact hole 27.

A wafer proceeded with the etching process and the washing process as mentioned above is transferred to a high vacuum system to be used for a subsequent process. At this time, regrowth of the native oxide layer is extensively minimal if the wafer is transferred to the high vacuum system within about 2 hours after applying the washing process.

Figure 2A:
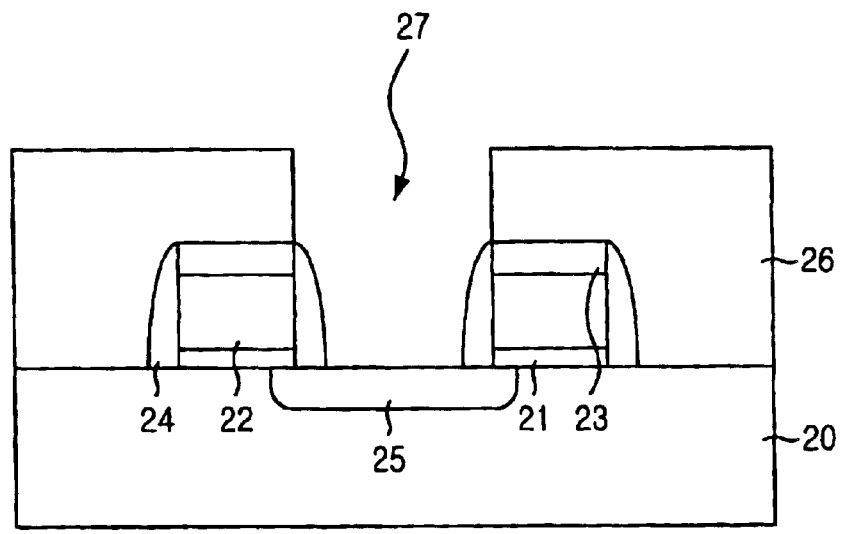
FIG. 2A is a cross-sectional view showing a method for preparing a semi-finished semiconductor substrate provided with a contact hole in accordance with a preferred embodiment of the present invention.
Figure 2B:
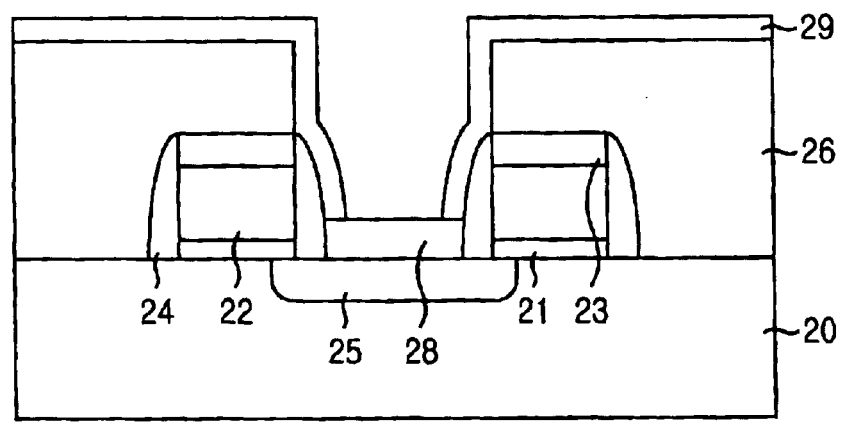
FIG. 2B is a cross-sectional view showing a method for forming a single crystal silicon on the contact hole in accordance with the preferred embodiment of the present invention.

With reference to FIG. 2B, a single crystal silicon 28 is put through an epitaxial growth at a bottom of the contact hole 27 through the use of the high vacuum system. The bottom of the contact hole 27 is a place to which the substrate 20 is contacted to, and thus, the epitaxial growth of the single crystal silicon 28 is possible. However, since lateral sides of the contact hole 27 is contacted to the spacer 24 constructed with the nitride layer and the inter-layer insulating layer 26 constructed with the oxide layer, there forms not a single crystal silicon but a polysilicon 29.

The reason for using the high vacuum system is because the growth of the native oxide layer is suppressed in case that environment of an inner reaction chamber is in a high vacuum state and the single crystal silicon 28, with a less amount of impurities, can be easily put through the epitaxial growth. In this preferred embodiment of the present invention, a high vacuum state wherein a pressure of the reaction chamber is set in a range from about $10^{-9}$ Torr to about $10^{-6}$ Torr is particularly applied.

The single crystal silicon 28 provided from the epitaxial growth is formed to a thickness ranging from about 50 Å to about 200 Å measured from the bottom surface of the contact hole 27. Also, the epitaxial growth is proceeded at a temperature in a range from about 550° C. to about 800° C. by employing such gas including Si, e.g., $SiH_4$ or $Si_2H_6$ as a source gas. The single crystal silicon 28 provided from the epitaxial growth can be used without being doped, or it can be doped by using $PH_3$ gas diluted in such inert gas as He, $N_2$ or Ar as a dopant.

The high vacuum system adapted in the present invention means an equipment wherein a pressure of the reaction chamber is less than about $10^{-8}$ Torr by being attached with a highly functioning pump, and it can be a single chamber type or a batch type. However, the highly functioning pump is attached mostly to the single chamber type. Despite of this fact, the high vacuum system in accordance with the present invention is not limited to adapt only the single chamber type equipment attached with the highly functioning pump.

In the present invention, the single crystal silicon 28 provided from the epitaxial growth in the high vacuum system suppresses the growth of the native oxide layer, and thus, the typical in-situ washing process is not additionally required. That is, even in case of omitting the hydrogen bake process or the rapid thermal process, it is still possible to prevent the degradation of the transistor and complications of the process.

A silicon crystal of the substrate 20 and the single crystal silicon 28 provided through the epitaxial growth have an identical crystal direction. This fact means that impurities including the native oxide layer exist minimally in between the substrate 20 and the single crystal silicon 28 provided through the epitaxial growth.

Since only the single crystal silicon 28 provided through the epitaxial growth exists, a systematic diffraction pattern can be obtained.

If measuring a selected area diffraction(SAD) pattern with respect to lateral sides of the contact hole 27, nonsystematic diffraction patterns will appear unlike to SAD patterns of the single crystal silicon 28. It is because the lateral sides of the contact hole 27 are formed with the polysilicon 29 instead of the single crystal silicon 28.

Figure 2C:
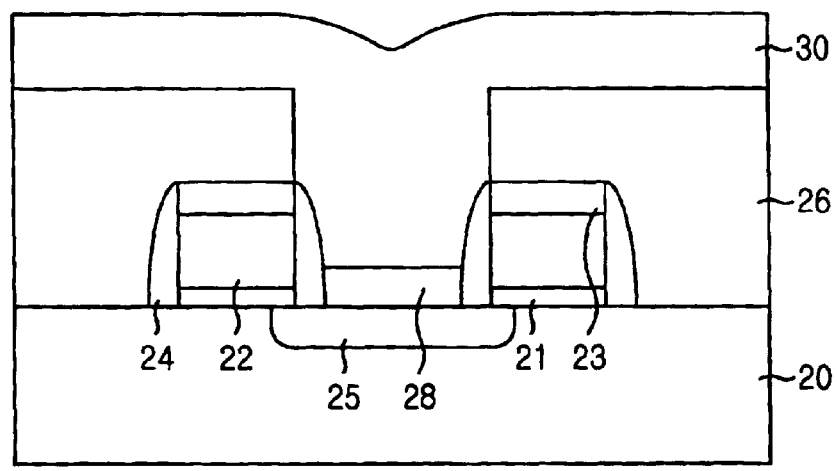
FIG. 2C is a cross-sectional view showing a method for forming a polysilicon on the single crystal silicon and the contact hole in accordance with the preferred embodiment of the present invention.

As seen from the above, the epitaxial growth is proceeded at the bottom part of the contact hole 27 contacted to the substrate 20 so as to form the single crystal silicon 28. Meanwhile, on the lateral sides of the contact hole 27, the polysilicon 29 is formed to a predetermined thickness. Subsequently, as depicted in FIG. 2C, the typical batch type equipment is used to form a polysilicon contact plug 30 which fills the contact hole 27.

In case of using the typical batch type equipment for forming the polysilicon contact plug 30, the polysilicon contact plug 30 is formed to a thickness ranging from about 1500 Å to about 3000 Å at a temperature ranging from about 480° C. to about 620° C. and a pressure ranging from about 0.2 Torr to about 1.5 Torr. Also, a source gas used for forming the polysilicon contact plug 30 is a gas including silicon.

Afterwards, a doping process is successively carried out in order to reduce resistance of the polysilicon contact plug 30. The doping process is proceeded in such that PH3 gas diluted in such inert gas as He, $N_2$ or Ar is used as a dopant so that a concentration of phosphorous (P) is in a range from about $1.0 \times 10^{20}$ atoms/cc to about $3.0 \times 10^{20}$ atoms/cc.

Figure 2D:
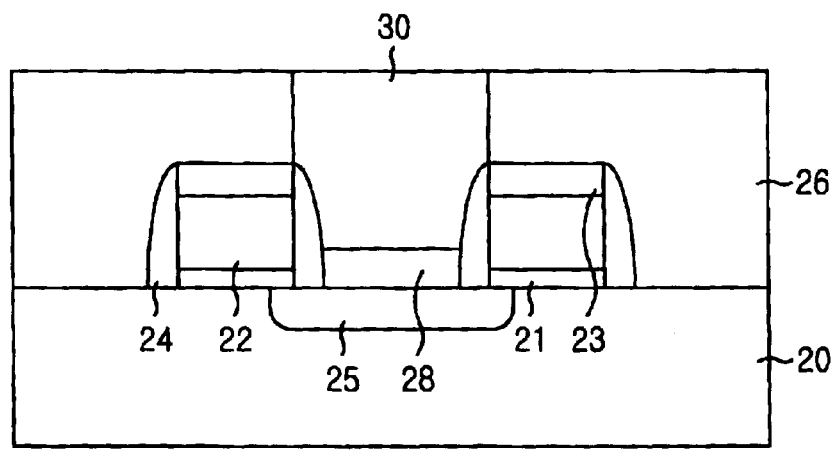
FIG. 2D is a cross-sectional view showing a method for forming a polysilicon contact plug in accordance with the preferred embodiment of the present invention.

After depositing the polysilicon contact plug 30 is deposited on an entire structure including the inner contact hole and an upper part of the inter-layer insulating layer 26, a CMP process or an etchback process is performed until exposing a surface of the inter-layer insulating layer 26 and completes the contact plug formation process as illustrated in FIG. 2D.

In case of performing the CMP process, such a polishing material as silica, alumina or ceria of which particle size ranges from about 50 nm to about 300 nm is used for implementing the CMP process.

In accordance with the preferred embodiment of the present invention, it is possible to form a contact plug of a semiconductor device capable of preventing complications of serial processes for forming the contact plug and simultaneously an increase of contact resistance occurring due to a native oxide layer, i.e., the contact resistance is reduced. Ultimately, it is possible to improve a confidence level of a semiconductor device due to the formation of the contact plug with a low contact resistance.

While the present invention has been described with respect to certain preferred embodiments, it will be apparent to those skilled in the art that various changes and modifications may be made without departing from the scope of the invention as defined in the following claims.

What is claimed is:

1. A method for forming a semiconductor device, comprising the steps of:
    forming a contact hole in an inter-layer insulating layer formed on a silicon substrate;
    removing a native oxide layer formed in the contact hole;
    forming a single crystal silicon layer on a surface of the silicon substrate in the contact hole and a first polysilicon layer on lateral sides of the contact hole, wherein the single crystal silicon layer is formed by an epitaxial growth performed at a first reaction chamber of which pressure is maintained less than approximately $10^{-6}$ Torr; and
    filling the contact hole with a second polysilicon layer, wherein the second polysilicon layer is formed at a second reaction chamber.

2. The method as recited in claim 1, wherein a pressure of the first reaction chamber ranges from about $10^{-9}$ Torr to $10^{-6}$ Torr.

3. The method as recited in claim 1, wherein the first reaction chamber is either a single type or a batch type equipment.

4. The method as recited in claim 1, wherein the step of filling the contact hole with the second polysilicon layer proceeded with a chemical vapor deposition process using batch type equipment of which pressure is maintained in a range from about 0.2 Torr to about 1.5 Torr.

5. The method as recited in claim 1, wherein the single crystal silicon layer is formed with $SiH_4$ gas or $Si_2H_6$ gas as a source gas.

6. The method as recited in claim 1, wherein the single crystal silicon layer has a thickness in a range from about 50 Å to about 200 Å.

7. The method as recited in claim 1, wherein the step of forming the single crystal silicon layer is performed at a temperature ranging from about 550° C. to about 800° C.

8. The method as recited in claim 1, wherein the step of forming the single crystal silicon layer includes the step of doping the single crystal with n-type dopant.

9. The method as recited in claim 8, wherein $PH_3$ gas and inert gas are used at the step of doping the single crystal silicon layer.

10. The method as recited in claim 1, wherein the second polysilicon layer has a thickness in a range from about 1500 Å to about 3000 Å.

11. The method as recited in claim 1, wherein the step of filling the contact hole with the second polysilicon layer further includes a step of doping the polysilicon.

12. The method as recited in claim 11, wherein the second polysilicon layer is doped with $PH_3$ gas and inert gas to a concentration of phosphorous ranging from about $1.0 \times 10^{20}$ atoms/cc to about $3.0 \times 10^{20}$ atoms/cc.

13. The method as recited in claim 1, wherein the step of removing the native oxide layer is proceeded with a buffer oxide etchant (BOE), HF solution or HF vapor.

* * * * *